United States Patent [19]

Mattei

[11] 3,949,301

[45] Apr. 6, 1976

[54] DIGITAL CLICK REMOVAL AND SQUELCH CONTROL CIRCUIT FOR AN FM RECEIVER

[75] Inventor: Anthony Mattei, Philadelphia, Pa.

[73] Assignee: Ford Motor Company, Dearborn, Mich.

[22] Filed: June 27, 1975

[21] Appl. No.: 591,223

[52] U.S. Cl. ............... 325/348; 325/323; 325/478
[51] Int. Cl.² ........................................ H04B 1/10
[58] Field of Search ............... 325/42, 65, 322–324, 325/371, 377, 473, 476, 478, 408, 402, 403; 178/DIG. 12; 179/1 VL, 1 D, 1 P; 328/165–167; 329/130, 126, 128

[56] References Cited
UNITED STATES PATENTS

| | | | |
|---|---|---|---|
| 3,437,937 | 4/1969 | Warfield | 325/478 |
| 3,588,705 | 6/1971 | Paine | 325/348 |
| 3,633,112 | 1/1972 | Anderson | 325/478 |
| 3,678,396 | 7/1972 | Hoffman | 325/474 |
| 3,843,928 | 10/1974 | Nishimura et al. | 325/348 |
| 3,904,969 | 9/1975 | Eastmond | 325/348 |

Primary Examiner—Benedict V. Safourek
Assistant Examiner—Jin F. Ng
Attorney, Agent, or Firm—Robert W. Brown; Keith L. Zerschling

[57] ABSTRACT

A digital click removal and squelch control circuit for a digital FM receiver. The digital receiver generates a series of binary number electrical signals each of which is representative of the instantaneous phase angle of a received frequency-modulated electrical signal or signal derived therefrom. The phase angle signals are differentiated to produce binary number electrical signals that represent the rate of change of phase angle, or, the instantaneous frequency of the received signal. During a given time interval, the phase change caused by the modulation of the received signal must be within a range determined by the bandwidth of the received frequency-modulated signal. Phase changes outside of this range represent electrical noise or clicks and are removed by the click removal circuit of the invention. If a predetermined number of clicks occur during a predetermined time interval, the squelch control circuit of the invention provides a squelch control signal which may be used to disable the output of the FM receiver. When the click rate decreases, the output of the FM receiver is restored.

10 Claims, 4 Drawing Figures

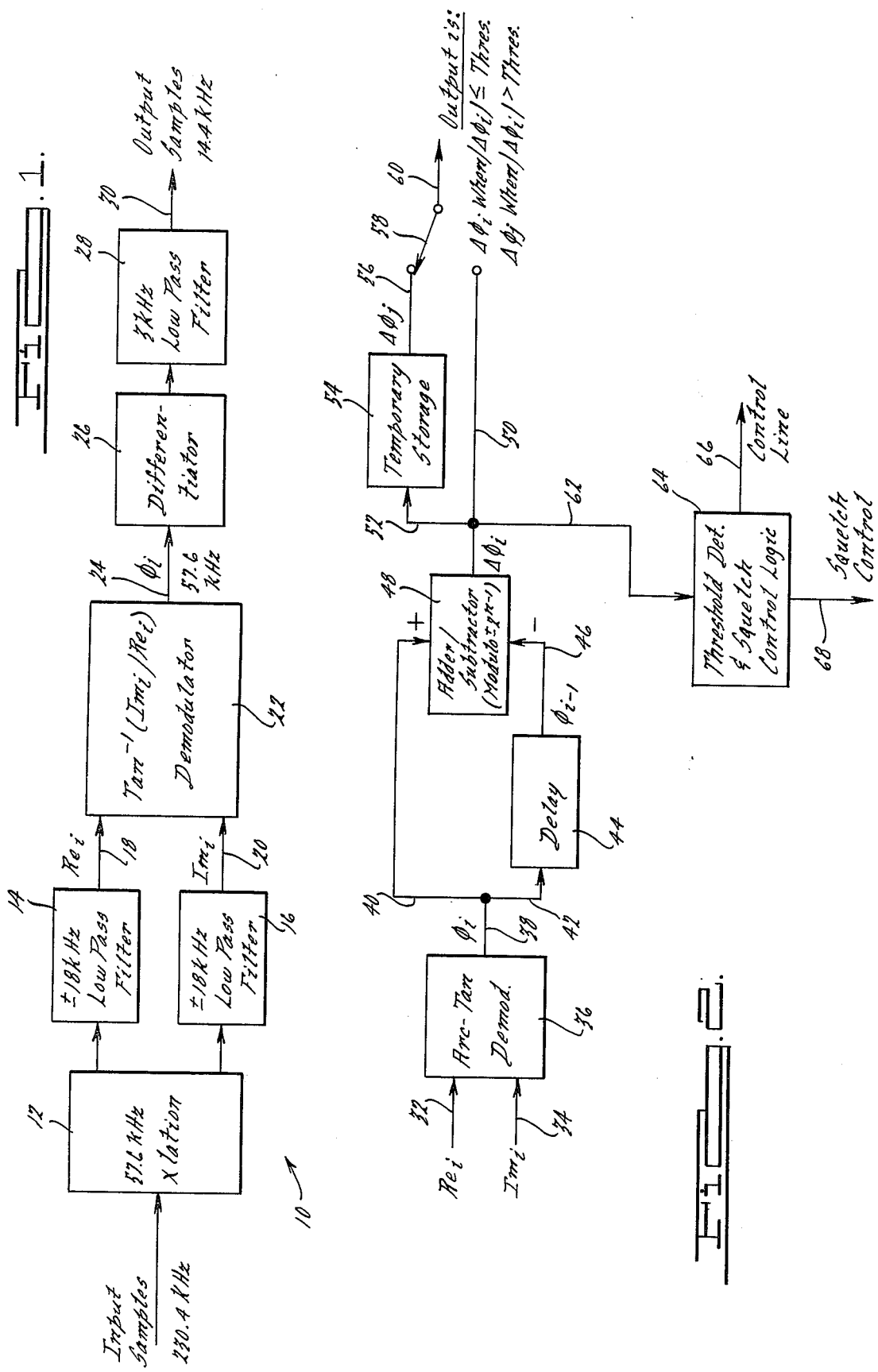

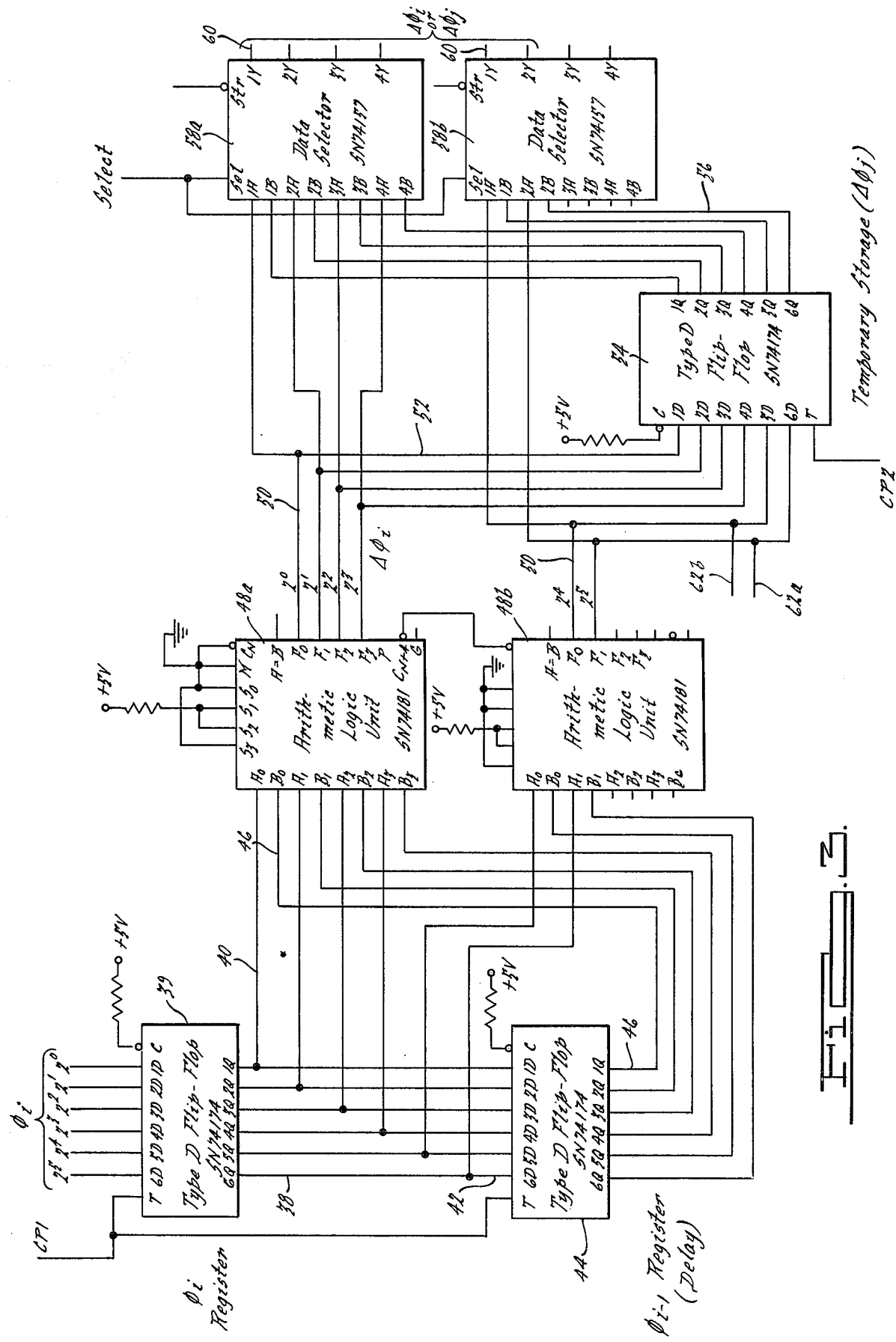

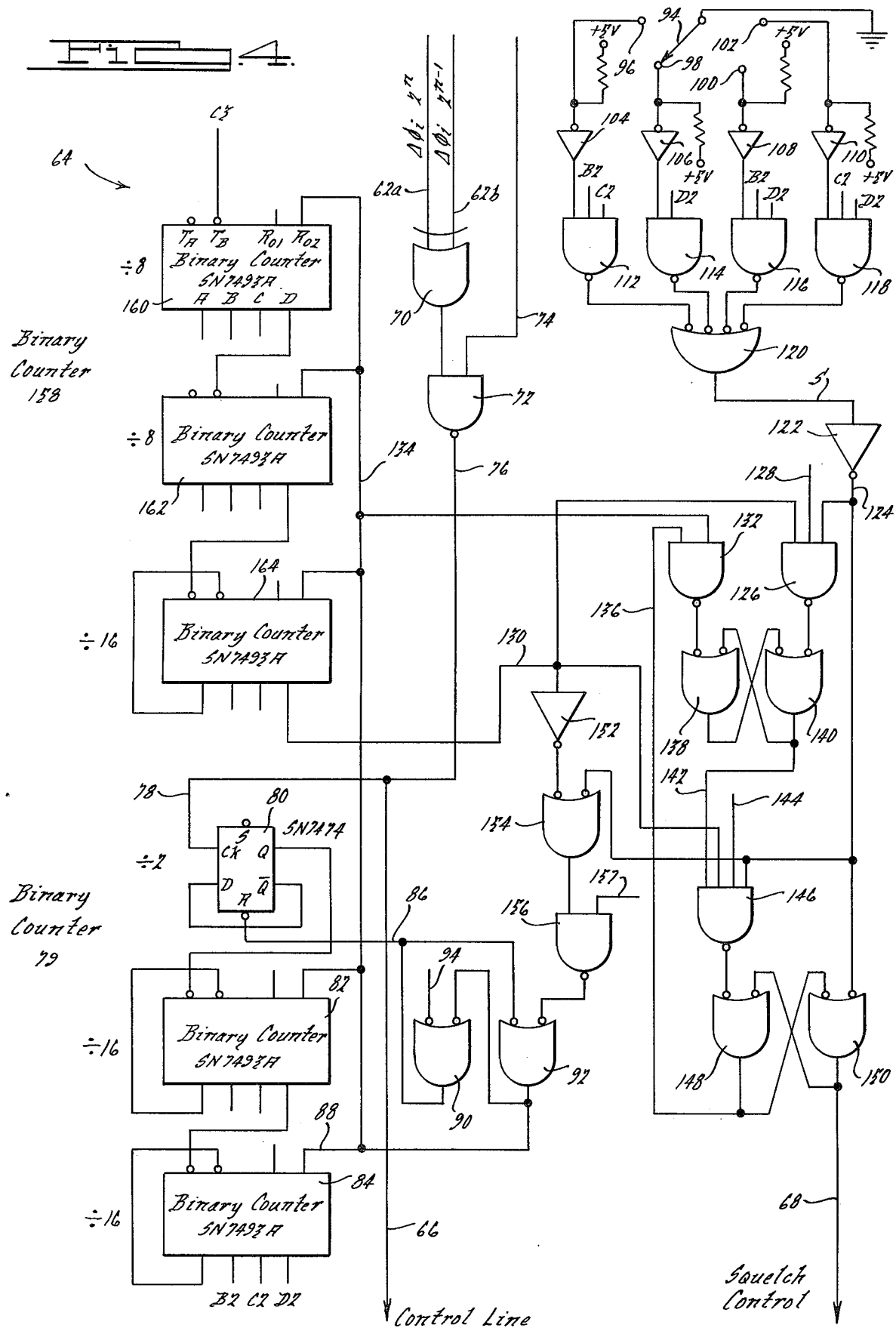

DIGITAL CLICK REMOVAL AND SQUELCH CONTROL CIRCUIT FOR AN FM RECEIVER

The invention herein described was made in the course of or under a contract or subcontract thereunder, (or grant) with the Department of the Air Force.

BACKGROUND

This invention relates to a digital click removal and squelch control circuit for an FM receiver which, preferably is completely digital in operation. More particularly, the invention relates to a click removal and squelch control circuit which operates on a series of binary number electrical signals, occurring at equally-spaced time intervals, each of which is representative of the instantaneous phase angle of a received frequency-modulated electrical signal or signal derived therefrom. The click removal circuit differentiates and, thus, demodulates the binary number electrical signals representative of phase angle, and removes or discards those of the differentiated binary number electrical signals which represent electrical noise or clicks. Also, if a predetermined number of clicks occur during a predetermined time interval, squelch control circuit means provides a squelch control signal to disable the output of the FM receiver.

The most widely used method of implementing squelch control in analog FM receivers consists of bandpass filtering of out-of-band noise at the output of the receiver's discriminator and disabling the audio amplifier whenever the average value of the rectified noise exceeds a preset threshold. The operations of bandpass filtering, rectification, lowpass filtering, and threshold decision can be implemented digitally in FM digital receivers. However, individual digital operations to replace the analog counterparts thereof would in general result in inefficient implementation.

Illustrative of prior art digital approaches to squelch control or electrical noise control are U.S. Pat. Nos. 3,437,937 to Warfield, 3,678,396 to Hoffman and 3,633,112 to Anderson.

In a digital FM receiver, a received frequency-modulated signal is sampled at equally-spaced time intervals to produce binary number electrical signals representative of the sampled values of the received signal. The binary number signals thus produced are down-converted or translated in frequency, utilizing digital techniques, to produce a series of binary number electrical signals having the carrier frequency removed. These translated binary number electrical signals are supplied to an arctangent demodulator which produces at its output binary number electrical signals representative of the instantaneouos phase angle of the received signal or a signal derived therefrom. The time derivative of the binary number signals representative of phase angle produces binary number electrical signal output samples representative of the instantaneous frequency of the received signal. Electrical noise or clicks appear as overly large changes in the phase angle between successive samples representative of the instantaneous phase angle.

In the digital click removal and squelch control circuit hereinafter described, the sampling rate at the output of the arctangent demodulator should be higher than the highest frequency component of the modulating signal. Preferably, in order to retain all of the information present at the input of the arctangent demodulator, the sampling rate should not be lower than the FM bandwidth, and preferably is on the order of one and one-half times the FM bandwidth.

SUMMARY OF THE INVENTION

It is an object of the invention to detect and remove or discard electrical noise, in the form of clicks or the like, from a frequency-modulated electrical signal received by an FM receiver or from a signal derived from such received signal. The time derivative of the instantaneous phase angle of the signal from which it is desired to remove the electrical noise is utilized to determine whether such noise is present. If the time derivative is above or below a predetermined threshold level, a click is determined to be present and is removed. The phase angles of the signal are generated in the FM receiver as a series of binary number electrical signals, representative of the instantaneous value of the phase angle and occurring at equally-spaced intervals of time. For each binary number electrical signal representative of the phase angle $\phi$, the time derivative $d\phi/dt$ is closely approximated by calculation of the function $\Delta\phi_i = \phi_i - \phi_{i-1}$ where $\phi_i$ designates a phase angle binary number electrical signal newly presented to the circuitry of the invention and $\phi_{i-1}$ represents a preceding, and preferably immediately preceding, binary number electrical signal representative of phase angle. The instantaneous frequency or phase change $\Delta\phi_i$ is a good approximation of $d\phi/dt$ where the sampling rate, that is the rate at which phase angle binary number electrical signals are supplied to the click removal and squelch control circuit, is much larger than the highest frequency component in the modulating signal.

According to the invention, where a click removal circuit is supplied with a series of binary number electrical signals as described above, a click removal circuit is provided which comprises first circuit means, supplied with the binary number electrical signals, for generating a difference binary number electrical signal each time one of the binary number electrical signals is supplied to the first circuit means, thereby, to generate a series of difference binary number electrical signals. Each new difference binary number electrical signal is generated in the first circuit means by the arithmetical subtraction, from a new one of the binary number electrical signals, of one of the binary number electrical signals preceding the new one of the binary number electrical signals. Also, second circuit means, controlled by the difference binary number electrical signals, are provided for discarding those of the difference binary number electrical signals which exceed a predetermined threshold level. Squelch control circuit means may be provided for counting the number of difference binary number electrical signals discarded by the second curcuit means during a predetermined time interval and for generating a squelch control electrical signal, suitable for use in disabling the output of the FM receiver, if the number of discarded binary number electrical signals exceeds a predetermined level.

The invention may be better understood by reference to the detailed description which follows and to the drawings.

BRIEF DESCRIPTION OF THE DRAWINGS

FIG. 1 is a schematic electrical block diagram of a portion of a digital FM receiver;

FIG. 2 is a schematic electrical block diagram of a digital click removal and squelch control circuit for an FM receiver;

FIG. 3 is a detailed schmatic electrical diagram of a portion of the circuitry illustrated in block form in FIG. 2; and FIG. 4 is a detailed schematic electrical diagram of another portion of the circuitry illustrated in block form in FIG. 2.

DETAILED DESCRIPTION

With reference now to the drawings, wherein like numerals or symbols refer to like items in the several views, there is shown in FIG. 1 a schematic electrical block diagram of a portion of a digital FM receiver. The circuit, generally designated by the numeral 10, includes a frequency translation circuit 12 having an input that is supplied with binary number electrical signals in the form of samples occurring at a rate of, for example, 230.4 kHz. These binary number input samples are generated in the digital FM receiver with circuitry (not shown) that samples the received frequency-modulated waveform at the indicated sample rate and then, through an analog-to-digital converter, converts the sampled analog amplitudes to binary number electrical signal form.

The translation circuit 12, in a manner analogous to the function of mixing in an analog receiver, multiplies the input samples by sine and cosine functions to produce two output signals that are supplied, respectively, to low-pass filters 14 and 16. In the circuit illustrated, it is assumed that the carrier frequency of the received FM signal is 57.6 kHz, and the translation circuit translates or down-converts the frequency spectrum of the input samples from a band centered about the 57.6 kHz carrier frequency to a band centered about zero Hz. The input to the low-pass filter 14 is a series of binary number electrical signals representing the real (Re) component of the frequency-translated signal and the input supplied to the low-pass filter 16 represents the imaginary (Im) component of the translated signal.

The received frequency-modulated signal may have a bandwidth of, for example, 33.6 kHz where the maximum frequency deviation of the transmitted signal is 8 kHz and where a 3 kHz modulating signal is utilized. Therefore, in the digital receiver, after translation down to base-band by the circuit 12, the Re and Im components are supplied to the low-pass filters 14 and 16 which have a ±18 kHz pass-band to eliminate frequencies outside of this bandwidth. The filters 14 and 16 preferably are digital convolutional filters and include circuitry for reducing the input sample rate to a rate of 57.6 kHz. The resulting real components, $Re_i$, are supplied on output 18 of the lowpass filter 14 to an arctangent demodulator 22, and the resulting imaginary components, $Im_i$, are supplied on output lead 20 of the filter 16 to the arctangent demodulator. The subscript $i$ here and in other locations in the drawings and description refers to the newest or most recent binary number electrical signal occurring at the circuit point indicated.

The arctangent demodulator 22 preferably has a circuit configuration as described in U.S. Patent application Ser. No. 591,224 filed June 27, 1975, in the names of John L. Robinson and the present inventor and entitled CIRCUIT FOR TRANSFORMING RECTANGULAR COORDINATE TO POLAR COORDINATE; the arctangent demodulator 22, however, may have any other suitable configuration for generating binary number electrical signals $\phi_i$ at its output 24 which are representative of the arctangent ($Im_i/Re_i$).

The binary number electrical signals $\phi_i$ appearing at the output 24 of the arctangent demodulator 22 are representative of the instantaneous phase angle of the received frequency-modulated electrical signal or a signal derived therefrom and occur at equally-spaced time intervals determned by the sample rate, which may be 57.6 kHz as illustrated in FIG. 1. These $\phi_i$ binary number electrical signals are supplied to a differentiator 26 that generates binary number electrical signals $\Delta\phi$ that represent the time rate of change of the phase angle signals. The binary number electrical signals $\Delta\phi$ may be supplied to a low-pass filter 28, which may, for example, have a 3 kHz passband, and the resulting samples, perhaps reduced in rate of occurrence, appear at the output 30 of the low-pass filter. These samples may be supplied to a digital-to-analog converter for converting the digital samples to analog form. The analog signal then will be the FM receiver output signal which may be supplied to a speaker or other output device.

With particular reference now to FIG. 2, there is shown a schematic electrical block diagram of a digital click removal and squelch control circuit for an FM receiver. The circuit of FIG. 2 includes an arctangent demodulator 36, which may be the arctangent demodulator 22 of a digital FM receiver and which has inputs 32 and 34 supplied with the real and imaginary components $Re_i$ and $Im_i$, respectively, of a received frequency-modulated electrical signal or signal derived therefrom. The output 38 of the demodulator 36 consists of a series of binary number electrical signals $\phi_i$ representative of the instantaneous phase angle corresponding to the arctangent of $Im_i/Re_i$. The binary number electrical signal $\phi_i$ is supplied on line 42 to a delay circuit 44 that has an output line 46 forming a second input to the adder/substractor 48. The binary number electrical signal $\phi_{i-1}$ appearing on line 46 is delayed by the time interval between occurrence of consecutive samples $\phi_i$ on line 38. In other words, the sample $\phi_{i-1}$ on line 46 is the phase angle binary number electrical signal which immediately preceded the phase angle binary number electrical signal $\phi_i$ appearing on lines 38 and 40.

The adder/subtractor 48 produces, on its output line 50, a difference binary number electrical signal $\Delta\phi_i = \phi_i - \phi_{i-1}$. Preferably, the binary number electrical signals $\phi_i$, $\phi_{i-1}$ and $\Delta\phi_i$ are in binary two's-complement form and the adder/subtractor 48 performs modulo ± $2^{n-1}$ subtraction, when n represents the number of bits of the electrical signals $\phi_i$, $\phi_{i-1}$ and $\Delta\phi_i$. In the detailed description which follows of the circuits illustrated in FIGS. 3 and 4, $n$ is equal to 6 and $\phi_i,\phi_{i-1}$ and $\Delta\phi_i$ may have positive values from, in two's-complement form, 000000 to 011111 (zero to +31) and negative values from 111111 to 100000 (−1 to −32).

The signal $\Delta\phi_i$ on line 50 is supplied via line 52 to a temporary storage register 54 having an output 56 at which a signal $\Delta\phi_j$ appears. A switch 58, which preferably is a solid state switch as is hereinafter described, has an output line 60 connected to it and has two positions wherein output line 60 is either connected by arm 58 or the equivalent to line 56 or to line 50. If line 60 is connected to line 50, then the output of the circuit is $\Delta\phi_i$; and if the line 60 is connected to line 56, the circuit output is $\Delta\phi_j$.

If, for a given set of quadrature input components $Re_i$ and $Im_i$, $\Delta\phi_i$ is calculated to have a magnitude in excess of a predetermined threshold, then a click is determined to have occurred and $\Delta\phi_i$ is not utilizedd as a circuit output, but rather a previously calculated difference binary number electrical signal $\Delta\phi_j$ is utilized by connecting output line 60 to line 56. On the other hand, if the $\Delta\phi_i$ magnitude is equal to or below the predetermined threshold level, then the new value $\Delta\phi_i$ is placed in the temporary storage register 54 and the output line 60 is connected to line 50 on which $\Delta\phi_i$ appears. The connection of the line 60 to line 56, whenever a click is determined to have occurred, results in the removal or discard of the $\Delta\phi_i$ click appearing on line 50.

The $\Delta\phi_i$ binary number electrical signal appearing on line 50 is supplied via a lead 62 to a threshold detector and squelch control logic circuit 64 having a control line output 66 and a squelch control line output 68. The threshold detector portion of the circuit 64 determines whether or not $\Delta\phi_i$ has a magnitude above the aforementioned predetermined threshold level. If $\Delta\phi_i$ is above this predetermined threshold level, a signal appears on the control line 66 to set the switch 58 to the position illustrated in FIG. 2 and to set the temporary storage register 54 to prevent its accepting or receiving for storage the $\Delta\phi_i$ that is above the predetermined threshold level. Thus, the temporary storage register 54 always retains a binary number electrical signal that has a magnitude below the predetermined threshold level.

The squelch control logic circuit portion of the circuit 64 includes curcuit means for counting during a predetermined time interval the number of difference binary number electrical signals $\Delta\phi_i$ having a magnitude exceeding the predetermined threshold level. If the count during a given time interval exceeds a predetermined number, then the squelch control line 68 is set with a signal appropriate for use in preventing the FM receiver from producing an audio or other output signal. This squelching of the FM receiver output may be accomplished in a digital FM receiver merely by setting the binary data-bit-inputs to a digital-to-analog converter in the receiver output circuit to zero levels. Of course, the squelch control on line 68 may be utilized in other ways to effect squelching of the FM receiver output. The squelch control logic circuit includes means for unsquelching the receiver output when the number of clicks occurring during a given predetermined time interval decreases to an acceptable level.

With particular reference now to FIG. 3, there is shown a more detailed schematic electrical diagram of the circuitry illustrated in FIG. 2 between lines 38 and 60. In FIG. 3, the binary number electrical signals $\phi_i$, $\phi_{i-1}$, $\Delta\phi_i$ and $\Delta\phi_j$ are each illustrated as consisting of six bits having a most significant bit of $2^5$ value and a least significant bit of $2^0$ value. The six bits of a signal $\phi_i$ are stored in a $\phi_i$ register 39 in the arctangent demodulator 36. This register 39 as illustrated is a type-D flip-flop having data inputs 1D through 6D and outputs 1Q through 6Q, the latter being identified as lines 38.

The output lines 38 form the input to the delay circuit 44, shown as a type-D flip-flop which acts as a $\phi_{i-1}$ register. Lines 42 couple the output of the flip-flop 39 to the input of the flip-flop 44. The flip-flops 39 and 44 are controlled by clock-pulse signals CP1 applied simultaneously to their respective trigger inputs T. Upon the occurrence of a CP1 clock pulse, the signal on output lines 38 of the flip-flop 39 is transferred to the output lines 46 of the flip-flop 4, and constitutes the signal $\phi_{i-1}$ on the output lines 46 of flip-flop 44. The input signal to the flip-flop 39 is transferred to its output lines 38 and constitutes the signal $\phi_i$. The $\phi_i$ binary number electrical signal on lines 38 is supplied via lines 40 to the A-inputs of arithmetic logic units 48a and 48b, which together comprise the adder/subtractor 48 of FIG. 2. Similarly, the output lines 46 of the flip-flop 44 supply the $\phi_{i-1}$ bits to the B-inputs of the arithmetic logic units 48a and 48b. The four least significant bits of each of the signals $\phi_i$ and $\phi_{i-1}$ are supplied to the arithmetic logic unit 48a, and the two most significant bits of each of these signals are supplied to the arithmetic logic unit 48b. The signals $\phi_i$ and $\phi_{i-1}$ are in binary two's-complement form and the arithmetic logic units 48a and 48b perform the operation $\Delta\phi_i = \phi_i - \phi_{i-1}$. The result of this operation appears at the F-outputs of the arithmetic logic units 48a and 48b, identified as output lines 50.

The four least significant bits of the $\phi_i$ signal appearing on output lines 50 are supplied to the 1A, 2A, 3A, and 4A inputs of the data selector 58a, and the most significant bits on lines 50 are supplied to the 1A and 2A inputs of a data selector 58b.

The $\phi_i$ signal on lines 50 is coupled via lines 52 to the data inputs of a temporary storage register 54 in the form of a type-D flip-flop. The four least significant bits of the Q-outputs from the flip-flop 54 are supplied to the inputs 1B, 2B, 3B and 4B of the data selector 58a and the two most significant bits of the flip-flop Q-outputs are suppled to the 1B and 2B inputs of the data selector 58b.

The data selectors 58a and 58b perform the function of the switch 58 illustrated in FIG. 2. The data selectors are controlled by a "select" logic signal applied to the select inputs of the data selectors. The level of this select logic signal determines whether the output lines 60 are coupled to the $\Delta\phi_i$ input lines 50 or to the $\Delta\phi_j$ input lines 56 from the output of the flip-flop 54. The flip-flop 54 is controlled by clock pulses CP2 applied to its trigger input T. Clock pulses CP2 are supplied to the flip-flop 54 only if the signal on the control line output 66 of the squelch control and logic circuit indicates that $\Delta\phi_i$ is of a magnitude less than or equal to the predetermined threshold level previously described. If the $\Delta\phi_i$ signal on lines 50 is above this predetermined threshold, then the $\Delta\phi_j$ signal on flip-flop 54 output lines 56 is maintained as a binary number electrical signal corresponding to the last $\Delta\phi$ signal that had a magnitude less than the predetermined threshold level. Also, if the $\Delta\phi_i$ signal is above the predetermined threshold level, the data selectors 58a and 58b select the lines 56 so that $\Delta\phi_j$ appears on the output lines 60. On the other hand, if $\Delta\phi_i$ is less than or equal to the predetermined threshold level, then the lines 50 are coupled to the lines 60 and $\Delta\phi_i$ appears thereon. The signals on lines 60 form the output of the digital click removal and squelch control circuit and may be coupled to a digital-to-analog converter circuit or other appropriate circuitry in the FM receiver.

With particular reference now to FIG. 4, there is shown a detailed schematic electrical diagram of a preferred threshold detector and squelch control logic circuit 64 illustrated in block form in FIG. 2.

The circuit 64 includes a threshold detector portion of the circuit, which portion is formed by an exclusive-OR gate 70 and a NAND-gate 72. The inputs 62a and 62b to the exclusive-OR gate 70 are the two most significant bits of the $\Delta\phi_i$ signal appearing on line 62 in FIG. 2 or on lines 62a and 62b in FIG. 3. With the exclusive-OR gate 70 thus connected, its output will be a logic one level whenever the two most significant bits of $\Delta\phi_i$ are different. Where $\Delta\phi_i$ is in two's-complement form and is obtained by modulo $\pm 2^{n-1}$ subtraction and where $\Delta\phi_i$ is a binary number electrical signal having the same number of bits as the minuend $\phi_i$ and the subtrahend $\phi_{i-1}$, the two most significant bits of $\Delta\phi_i$ are the same over a range of values for $\Delta\phi_i$ and are different for values of $\Delta\phi_i$ outside of this range. For example, if $\Delta\phi_i$ is of two's-complement form and six bits, then the two most significant bits of $\Delta\phi_i$ are the same for values thereof from $-16$ (binary two's-complement 110000) to $+15$ (binary two's-complement 001111). For values of $\Delta\phi_i$ from $+16$ (binary two'-complement 010000) to $+31$ (binary two's-complement 011111) and for $\Delta\phi_i$ from $-17$ (binary two's-complement 101111) to $-32$ (binary two's-complement 100000), the two most significant bits of $\Delta\phi_i$ are different. Thus, the output of the exclusive-OR gate 70 is a logic one level whenever the binary number electrical signal $\Delta\phi_i$ has a magnitude in excess of a predetermined threshold level (with six bits, the threshold level magnitude is 15 or 16 depending, respectively, upon whether $\Delta\phi_i$ in two's-complement form is positive or negative).

The output of the exclusive-OR gate 70 forms one of the inputs to the NAND-gate 72, the other input to which is a line 74 to which a logic one sampling signal is applied at times when it is desired to determined if $\Delta\phi_i$ has a magnitude exceeding the predetermined threshold level. NAND-gate 72, controlled by the exclusive-OR gate 70, inverts the sampling pulse on its output lead 76 whenever the predetermined threshold level is exceeded and the sampling pulse occurs on line 74. The control line 66 output from the circuit 64 is coupled to the lead 76 and may be utilized, either directly or in conjunction with logic gate circuitry, to control the temporary storage register 54 and the selector switch 58 (data selectors 58a and 58b).

Logic circuitry other than an exclusive-OR gate may be utilized to set any predetermined threshold level that may be desired for a determination that a click has occurred.

The squelch control portion of the circuit 64 illustrated in FIG. 4 is utilized to count the number of clicks that occur during established time intervals of predetermined duration. Each click, of course, is determined by the appearance of a logic one at the output of the exclusive-OR gate 70.

The length of the predetermined time interval during which the clicks are counted is determined by a binary counter 158. Binary counter 158 is comprised of commercially available binary counters 160, 162 and 164. Binary counter 160 has a clock input C3 to which fixed frequency clock pulses, for example 7.2 kHz, are supplied. The circuit as connected provides a division of this clock frequency by 1,024 to produce a square wave signal on output lead 130 from the binary counter 158 having a 50% duty cycle and a period of 0.1422 seconds. Due to the 50% duty cycle, this signal on output lead 130 will have a low logic level for predetermined time intervals of 0.0711 seconds and a high logic level of corresponding duration. During each of the low level portions of the signal appearing on the output lead 130, the number of clicks are counted.

It is the function of binary counter 79 to count the number of clicks during each of the time intervals when the signal on lead 130 is at a low logic level. The binary counter 79 includes a type-D flip-flop 80 having its clock input connected by lead 78 to the lead 76 on which the click signals occur. The binary counter 79 also includes commercially available binary counters 82 and 84, and further comprises the circuitry shown in the upper right-hand portion of FIG. 4 including a switch 94, resistors associated with switch 94, invertors 104, 106, 108 and 110, NAND-gates 112, 114, 116 and 118, and a gate 120 having its four inputs coupled to the outputs of the NAND-gates.

The switch 94 has four poles 96, 98, 100 and 102, any one of which may be connected to ground through the movable arm of the switch. Preferably, the switch 94 is mounted on an exterior panel of the FM receiver and permits selection of the level at which squelch is applied, that is, it permits direct selection of the number of clicks required during a predetermined time interval to result in a squelched FM receiver output. The B2, C2 and D2 outputs of the binary counter 84 are connected to the input terminals of NAND-gates 112, 114, 116 and 118 as indicated. With these connections and with a C3 clock frequency of 7.2 kHz and the binary counter 158 connections indicated, connection of the switch 94 to the poles 96, 98, 100 or 102 provides binary counter 79 counting, respectively, of 192 counts, 256 counts, 320 counts or 384 counts during each 0.0711 second time interval in which the signal on lead 130 is a low logic level. Thus, with the switch 94 positioned as shown in FIG. 4, 256 clicks or logic one level signals would have to occur at the output of the exclusive-OR gate 70 during one interval in which the signal on lead 130 is at a low level in order to produce a logic one level sqelch signal S at the output of the gate 120.

The remaining circuitry illustrated in FIG. 4 includes a squelch flip-flop comprising gates 146, 148 and 150, a second flip-flop comprised of gates 126, 132, 138 and 140, and a reset flip-flop comprising invertor 152 and gates 90, 92, 154 and 156. An invertor 122 inverts the squelch signal S to produce a logic zero level signal on its output lead 124 whenever a number of clicks is detected indicating the desirability of squelching the FM receiver output. As was mentioned previously, the squelch control output lead 68, the output of the squelch flip-flop, may be utilized to squelch the FM receiver output in any suitable manner. A logic one level signal appears on the squelch control line 68 whenever a squelch condition exists. This condition results from the appearance of a logic zero level signal on lead 124.

Lead 124 from the invertor 122 is connected to one input of the gate 154 in the reset flip-flop. The other input to this gate is the complement of the signal appearing on lead 130, the output lead of the binary counter 158. Thus, the binary counters 158 and 79 are reset whenever a squelch signal S occurs or a positive-going edge of the signal on lead 130 occurs to indicate the end of a time interval. Binary counters 82, 84, 160, 162 and 164 are reset by a logic one level signal appearing on leads 88 and 134, and the type-D flip-flop 80 is reset by a logic zero level signal occurring on lead 86. The exact time at which reset occurs is controlled by a signal applied to input lead 157 of gate 156.

Whenever the logic one signal appears on lead 130, the signal on lead 124 is sampled by the second flip-flop, which includes gates 126, 136, 138 and 140, to determine if a squelch condition exists. Input lead 128 to the gate 126 permits selection of the sample time. If a squelch condition does not exist, then the second flip-flop is set with a logic one level on its lead 142. During the next time interval in which the lead 130 is at a logic one level, the signal on lead 124 again is sampled to determine if a squelch condition exists and, if it does not, the second flip-flop is reset so that a logic zero level signal appears on its output lead 142. Thus, after the occurrence of a squelch condition, two consecutive time intervals are required before lead 142 is set at a logic zero condition permitting the squelch flip-flop to produce a logic zero level on its squelch control line 68 to unsquelch the FM receiver. The signals on gate input leads 128, 144, 94 and 157 are utilized to prevent undesirable logic signal races in the control circuit.

Various modifications may be made in the described click removal and squelch control circuit without departing from the spirit and scope of the invention.

Based upon the foregoing description of the invention, what is claimed is:

1. In combination with an FM receiver that includes circuit means for generating a series of binary number electrical signals, occurring at equally-spaced time intervals, each of which is representative of the instantaneous phase angle of a received frequency-modulated electrical signal or signal derived therefrom, a click removal circuit for removing those of said binary number electrical signals determined to represent electrical noise, said click removal circuit comprising:
   first circuit means, supplied with said binary number electrical signals, for generating a rate of change binary number electrical signal proportional to the time rate of change of said binary number electrical signals; and
   second circuit means, controlled by said rate of change binary number electrical signal, for removing or discarding said rate of change binary number electrical signal if the magnitude of said rate of change binary number electrical signal exceeds a predetermined threshold level.

2. A click removal circuit according to claim 1 which further includes squelch control circuit means for counting the number of said rate of change binary number electrical signals removed or discarded by said second circuit means during a predetermined time interval and for generating a squelch control electrical signal if said number of removed or discarded rate of change binary number electrical signals exceeds a predetermined level.

3. In combination with an FM receiver that includes circuit means for generating a series of binary number electrical signals, occurring at equally-spaced time intervals, each of which is representative of the instantaneous phase angle of a received frequency-modulated electrical signal or signal derived therefrom, a click removal circuit for removing those of said binary number electrical signals determined to represent electrical noise, said click removal circuit comprising:
   first circuit means, supplied with said binary number of electrical signals, for generating a difference binary number of electrical signal each time one of said binary number electrical signals is supplied to said first circuit means, thereby, to generate a series of difference binary number electrical signals, each new difference binary number electrical signal being generated in said first circuit means by the arithmetical subtraction from a new one of said binary number electrical signals of one of said binary number electrical signals preceding said new one of said binary number electrical signals; and
   second circuit means, controlled by said difference binary number electrical signals, for discarding those of said difference binary number electrical signals which exceed a predetermined threshold level.

4. A click removal circuit according to claim 3 which further includes squelch control circuit means for counting the number of said difference binary number electrical signals discarded by said second circuit means during a predetermined time interval and for generating a squelch control electrical signal if said number of discarded difference binary number electrical signals exceeds a predetermined level.

5. A click removal circuit according to claim 4 wherein said squelch control circuit means comprises first binary counter means for generating pulses of predetermined duration corresponding to said predetermined time interval, and second binary counter means, controlled by said difference binary number electrical signals, for counting the number of said difference binary number electrical signals discarded by said second circuit means.

6. A click removal circuit according to claim 3 wherein said second circuit means includes means for storing those of said difference binary number electrical signals which are less than or equal to said predetermined threshold level.

7. A click removal circuit according to claim 6 wherein said second circuit means includes an output terminal, means for coupling said output terminal to said storing means when said difference binary number electrical signals exceed said predetermined threshold level.

8. A click removal circuit according to claim 7 which further includes squelch control circuit means for counting the number of said difference binary number electrical signals discarded by said second circuit means during a predetermined time interval and for generating a squelch control electrical signal if said number of discarded binary number electrical signals exceeds a predetermined level.

9. A click removal circuit according to claim 6 wherein said means for coupling said output terminal of said second circuit means to said storing means comprises gate circuit means for examining a plurality of bits of each new difference binary number electrical signal generated by said first circuit means, and data selector means, controlled by said gate circuit means, for coupling said output terminal of said second circuit means to said first circuit means or to said storing means.

10. A click removal circuit according to claim 9 wherein said difference binary number electrical signals comprise a plurality of bits of different mathematical significance, and wherein said gate circuit means comprises an exclusive-OR gate having a plurality of inputs supplied with selected bits of said difference binary number electrical signals, said exclusive-OR gate having an output controlling said second binary counter means and said data selector means.

* * * * *

UNITED STATES PATENT OFFICE
CERTIFICATE OF CORRECTION

Patent No. 3,949,301  Dated April 6, 1976

Inventor(s) Anthony Mattei

It is certified that error appears in the above-identified patent and that said Letters Patent are hereby corrected as shown below:

On the cover sheet Item (73)

Assignee: should read -- Aeronutronic Ford Corporation --.

Signed and Sealed this

Twenty-seventh Day of July 1976

[SEAL]

Attest:

RUTH C. MASON  
*Attesting Officer*

C. MARSHALL DANN  
*Commissioner of Patents and Trademarks*